(12) United States Patent
Matsuura et al.

(10) Patent No.: US 6,717,275 B2
(45) Date of Patent: Apr. 6, 2004

(54) SEMICONDUCTOR MODULE

(75) Inventors: Tetsuya Matsuura, Tokyo (JP);
Yasushi Kasatani, Tokyo (JP); Tadashi Ichimasa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/134,427

(22) Filed: Apr. 30, 2002

(65) Prior Publication Data

US 2003/0080438 A1 May 1, 2003

(30) Foreign Application Priority Data

Oct. 29, 2001 (JP) ....................... 2001-331261

(51) Int. Cl.[7] .................. H01L 23/48; H01L 23/52; H01L 29/40
(52) U.S. Cl. .................. 257/778; 257/685; 257/686; 257/688; 257/693; 257/698; 257/723; 257/777
(58) Field of Search .................. 257/685–686, 257/777–778, 723, 688, 693, 698

(56) References Cited

U.S. PATENT DOCUMENTS

| | | | | |
|---|---|---|---|---|
| 5,279,029 A | * | 1/1994 | Burns | 29/856 |
| 5,373,189 A | * | 12/1994 | Massit et al. | 257/686 |
| 5,587,341 A | * | 12/1996 | Masayuki et al. | 438/109 |
| 5,677,569 A | * | 10/1997 | Choi et al. | 257/686 |
| 5,754,408 A | * | 5/1998 | Derouiche | 361/773 |
| 5,811,877 A | * | 9/1998 | Miyano et al. | 257/706 |
| 5,910,885 A | * | 6/1999 | Gulachenski et al. | 361/774 |
| 6,153,929 A | * | 11/2000 | Moden et al. | 257/686 |
| 2002/0000645 A1 | * | 1/2002 | Sato et al. | 257/666 |
| 2002/0105068 A1 | * | 8/2002 | Fukumoto et al. | 257/686 |
| 2002/0109221 A1 | * | 8/2002 | King et al. | 257/723 |

FOREIGN PATENT DOCUMENTS

| | | |
|---|---|---|
| JP | 62-260353 | 11/1987 |
| JP | 9-199665 | 7/1997 |
| JP | 10-242379 | 9/1998 |
| JP | 10-289929 | 10/1998 |
| JP | 11-186454 | 7/1999 |
| JP | 2001-35960 | 2/2001 |

\* cited by examiner

Primary Examiner—Amir Zarabian
Assistant Examiner—Ida M. Soward
(74) Attorney, Agent, or Firm—McDermott, Will & Emery

(57) ABSTRACT

A plurality of substrates are stacked on top of each other. A flexible cable serially connects the substrates. Semiconductor packages are mounted on the surfaces of the substrates. An adhesive material bonds adjoining semiconductor packages and holds the semiconductor packages in place with respect to each other. The bottommost substrate is provided with external leads by which the semiconductor module is mounted on the motherboard.

5 Claims, 8 Drawing Sheets

SEMICONDUCTOR MODULE

FIELD OF THE INVENTION

This invention relates to semiconductor modules. Particularly, this invention relates to semiconductor modules with very compactly mounted semiconductor chips.

BACKGROUND OF THE INVENTION

FIG. 12A and FIG. 12B show the structure of this type of semiconductor module. FIG. 12A is a top view and FIG. 12B is a side view of the conventional semiconductor module. This semiconductor module is made of a semiconductor package 1 mounted on either side of a substrate 2. The semiconductor package 1 is obtained by sealing a not shown semiconductor chip with a seal 1a. The semiconductor package 1 is mounted on the substrate 2 using external leads 1b. Moreover, external connecting terminals 5 are provided on the substrate 2.

FIG. 13A and FIG. 13B show ways in which the semiconductor module shown in FIGS. 12A and 12B can be mounted. FIG. 13A shows an example in which two semiconductor modules are mounted next to each other whereas FIG. 13B shows an example in which the two semiconductor modules are stacked one on top of another. These semiconductor modules perform desired functions when they are connected to the motherboard 9 via external connecting terminals 5, 5'.

There has been a demand for small sized, slim, high performance electronic gadgets in the past year, contrary to the preceding years. The important question here would be how to pack semiconductor chips compactly in order to make the electronic gadget small and slim.

However, if a plurality of semiconductor modules are arranged side by side as shown in the FIG. 13A, the motherboard 9 on which the semiconductor modules are to be mounted will have to have sufficient surface area to accommodate the sate semiconductor modules. Thus, the mounted semiconductor package 1 (semiconductor chip) would still not be compact enough.

If the semiconductor modules are packed one on top of another as shown in FIG. 13B, they would occupy less surface area on the motherboard as compared to the side-by-side arrangement.

However, when multiple semiconductor modules are to be stacked one on top of another, there should be enough space between the adjacent semiconductor packages. This space is mandatory to avoid any kind of damage to the semiconductor modules because of their mutual contact due to heat generation or vibration.

Consequently, it is necessary to lengthen the external connecting terminals 5 of the upper semiconductor module. This may reduce the rigidity of the external connecting terminals 5 thereby making it difficult to fix the upper semiconductor module to the motherboard 9.

The external connecting terminals 5 of the upper semiconductor module will have to be placed externally to the external connecting terminals of the lower semiconductor module. As the number of layers of semiconductor modules increases, the surface area of the motherboard increases to the extent required for fixing the external connecting terminals 5.

SUMMARY OF THE INVENTION

It is an object of this invention to provide a semiconductor module in which semiconductor chips are mounted compactly and reliably.

The semiconductor module according to one aspect of this invention comprises a plurality of substrates connected serially through a flexible cable and stacked together, wherein semiconductor chips are mounted on at least surfaces facing each other of the substrates, and the semiconductor chips of adjoining one of the substrates being bonded to each other.

According to the above aspect, a plurality of substrates with semiconductor chips mounted on them are stacked together. Furthermore, these semiconductor chips of adjoining substrates are bonded to each other and thereby held in position. Therefore, there is no possibility that the chips come in contact with each other, moreover, the substrates can be stacked with minimum space between them.

In the above-mentioned semiconductor module, at least one of an outermost substrate in the stacked substrates is provided with external connecting terminals by which the substrate can be mounted on the motherboard.

Thus, the semiconductor module can be mounted on the motherboard using the external connecting terminals provided on the outermost substrate.

In the above-mentioned semiconductor module, the external connecting terminals are leads extending outward from the outermost substrate.

Thus, the semiconductor module can be mounted on the motherboard using the leads provided on the outermost substrate.

In the above-mentioned semiconductor module, a plurality of sockets corresponding to the external connecting terminals of the substrates are provided on the motherboard, wherein the external connecting terminals are connector pins that can be inserted into or removed from the sockets provided on the motherboard.

Thus, the semiconductor module can be attached to or detached from the motherboard by connector pin-socket arrangement.

In the above-mentioned semiconductor module, the external connecting terminals are bumps that aid mounting of the module on the surface of the motherboard.

Thus, the semiconductor module can be mounted on the surface of the motherboard utilizing the bumps.

In the above-mentioned semiconductor module, the outermost substrate on which the bumps are provided is also provided with dummy members for smoothening out distortions that occur in the bumps.

Thus, dummy components are provided for smoothening out the distortions of the bumps.

The above-mentioned semiconductor module comprises external connecting terminals for mounting the substrates upright on the motherboard.

Thus, external connecting terminals are provided to mount the semiconductor module to the motherboard, and thereby the substrates can be mounted upright on the motherboard.

In the above-mentioned semiconductor module, the external connecting terminals are provided at ends of the substrates that are held in place with respect to each other.

Thus, the substrates are held in place with respect to each other on the motherboard.

In the above-mentioned semiconductor module, the external connecting terminals are leads that extend outward from the substrate.

Thus, leads are provided to mount the semiconductor module on the motherboard.

In the above-mentioned semiconductor module, a plurality of connectors corresponding to the external connecting terminals of the substrates are provided on the motherboard, wherein the external connecting terminals are connector terminals that can be attached to or removed from the connectors provided on the motherboard.

Thus, a connecting terminal-connector arrangement is provided so that the semiconductor module can be attached to or removed from the motherboard.

In the above-mentioned semiconductor module, the ends of the substrates on which the connector terminals have been mounted protrude beyond the ends of other substrates.

Thus, ends of the substrates on which the connector terminals are mounted are lower than the ends of the other substrates.

In the above-mentioned semiconductor module, the semiconductor chips are mounted on the substrate using external leads.

Thus, the semiconductor chips are mounted on the substrate by external leads.

In the above-mentioned semiconductor module, the semiconductor chips are mounted on the surface of the substrate.

Thus, the semiconductor chip is surface-mounted on the substrate.

In the above-mentioned semiconductor module, the semiconductor chips are mounted on the substrate using bare chip technology.

Thus, the semiconductor chips are mounted on the substrate using bare chip technology.

Other objects and features of this invention will become apparent from the following description with reference to the accompanying drawings.

BRIEF DESCRIPTION OF THE DRAWINGS

FIG. 1A and FIG. 1B show a structure of the semiconductor module of first embodiment according to the present invention in which FIG. 1A is a top view and FIG. 1B is a side view, FIG. 6A and FIG. 6B show a structure of the semiconductor module of fifth embodiment according to the present invention in which FIG. 6A is a side view and FIG. 6B is a view along a direction indicated by an arrow A in FIG. 6A, FIG. 7A and FIG. 7B show a structure of the semiconductor module of sixth embodiment according to the present invention in which FIG. 12A and FIG. 12B show a structure of a conventional semiconductor module in which FIG. 12A is a top view and FIG. 12B is a side view, and FIG. 13A and FIG. 13B show that the conventional semiconductor module is mounted on a motherboard in which FIG. 13A is a side view of a case in which the semiconductor modules are mounted on the motherboard laterally, and FIG. 13B is a side view of a case in which the semiconductor modules are mounted on the motherboard vertically.

DETAILED DESCRIPTIONS

Embodiments of the semiconductor module according to this invention are explained below in detail with the help of the accompanying drawings.

Figure 1A:
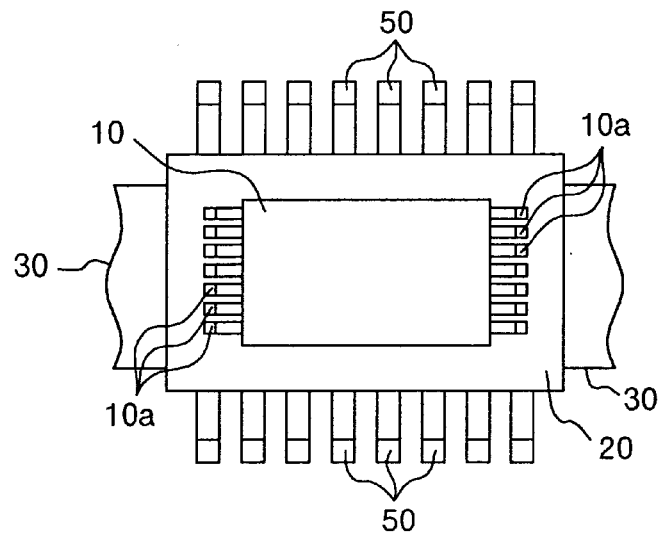
Figure 1B:
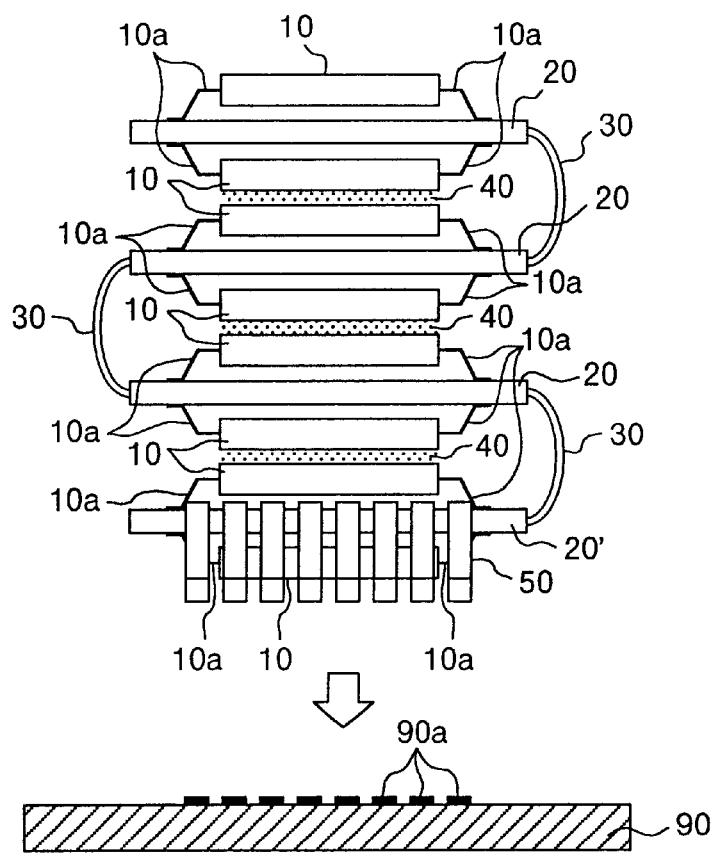

FIG. 1A and FIG. 1B show a first embodiment of the semiconductor module of this invention. FIG. 1A is a top view and FIG. 1B is a side view of the semiconductor module of this invention. This semiconductor module could, for instance, be used as memory module. This semiconductor module comprises a plurality of substrates 20 (although only 4 substrates are shown in this figure) stacked one on top of another.

These substrates 20 are made of resin such as glass epoxy which has comparatively high rigidity. A semiconductor package 10 is mounted on either side of each substrate. The semiconductor package 10 comprises a not shown semiconductor chip, sealed with a seal, and mounted on the substrate 20 by external leads 10a. The packages 10 mounted on adjoining substrates 20 are bonded together and held in place by an adhesive 40.

The substrates 20 are connected serially by a flexible cable 30. The Flexible cable 30 is made of a conductor, not shown, coated with an insulation film and therefore has enough flexibility to connect the adjacent substrates 20 to each other. Polyimide, polyester, polypropylene, polycarbonate etc. are preferable but any material with enough flexibility can be used as an insulation film. Any material with conductivity like copper can be used as a conductor of the flexible cable 30.

Figure 2:
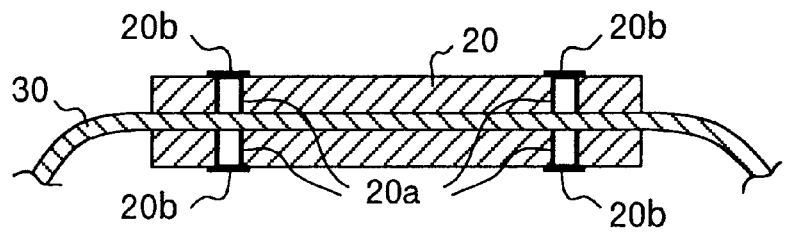
FIG. 2 shows a cross-section of the key section of the semiconductor module shown in FIG. 1.

FIG. 2 shows a cross section of the substrate 20. The flexible cable 30 is embedded in the substrate 20 and passes through through holes 20a provided in the substrate 20 and connects to the wiring pattern 20b in the substrate 20.

The outermost substrate (e.g. the bottommost substrate to which the legend 20' is assigned to show it is different from the other substrates) is provided with the external connecting leads 50, which are external connecting terminals for mounting the semiconductor module on the motherboard 90. These leads 50 are facing downwards from the bottommost substrate 20' and extend externally. An effective height of these leads 50 is greater than the semiconductor package 10 mounted on the backside of the substrate 20'.

Although not shown in the figure, the external connecting leads 50 provided on the substrate 20' are connected to the wiring 20b on the substrate 20'. The semiconductor package (i.e. the semiconductor chips) 10 mounted on the substrates 20 and bottommost substrate 20' performs the desired function when the semiconductor module is mounted on the motherboard 90 through the external connecting leads 50.

Since the semiconductor module of the first embodiment is assembled as described above—with semiconductor packages 10 mounted on the two surfaces of the substrates 20 and the bottommost substrate 20' and stacked up together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness. Moreover, as the semiconductor module can be mounted on the motherboard 90 by the external connecting leads 50 provided to the bottommost substrate 20', it does not matter even if the external connecting leads 50 have the same rigidity as the conventional art. In addition, no matter how many layers of semiconductor packages 10 are added to the assembly, the spread of the assembly remains the least.

Thus, the compactness with which the semiconductor package 10 can be provided can be dramatically improved. If these semiconductor packages 10 are used in the electronic gadgets, then compact, thin electronic gadgets with high functionality and high efficiency can be obtained.

In the semiconductor module according to the first embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

A second embodiment of this invention will be explained below. In the semiconductor module of the first embodiment, the external connecting leads 50 are provided as external connecting terminals on the bottommost substrate 20'. However, in this second embodiment, the bottommost substrate is provided with connector pins as the external connecting terminals.

Figure 3:
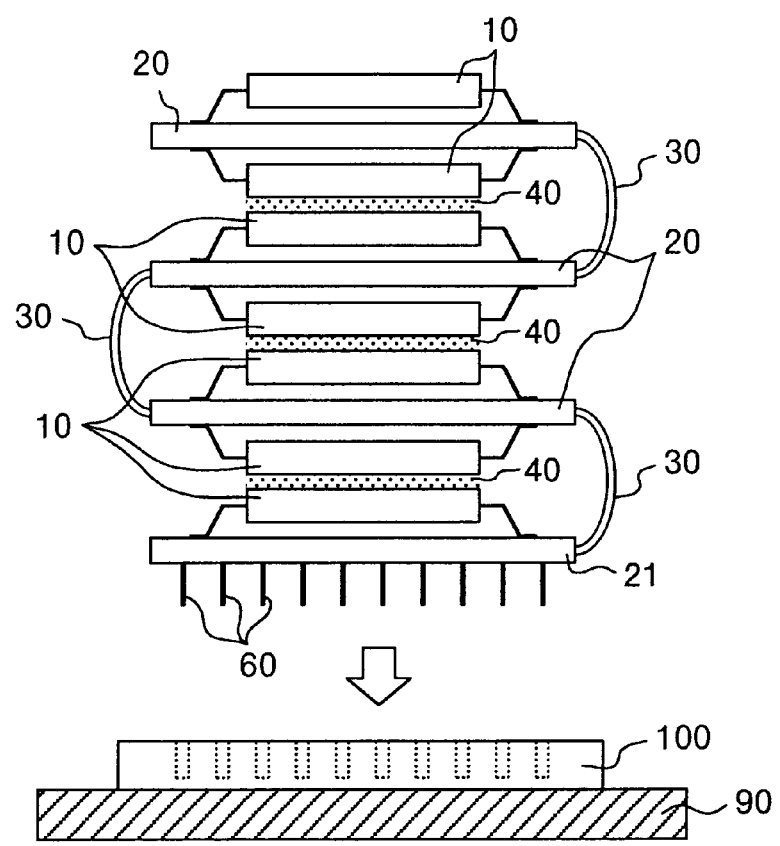
FIG. 3 is a side view of the semiconductor module of the second embodiment of the present invention.

FIG. 3 shows the second embodiment of the semiconductor module. As shown in this figure, the bottom surface of a bottommost substrate 21 is provided with connector pins 60. These connector pins 60 can be attached to or removed from the sockets 100 provided on the motherboard 90.

The other features of the semiconductor module of the second embodiment are similar to those of the semiconductor module of the first embodiment. In other words, the plurality of substrates 20 and the bottommost substrate 21 are serially connected by the flexible cable 30 and are stacked together. The adhesive material 40 holds the adjoining semiconductor packages 10 by bonding.

Since the semiconductor module of the second embodiment is assembled as described above—with semiconductor packages 10 mounted on the two surfaces of the substrates 20 and also on the bottommost substrate 21 and stacked up together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness. Moreover, as the semiconductor module can be mounted on the motherboard 90 by the connector pins 60 provided to the bottommost substrate 21, it does not matter even if the connector pins 60 have the same rigidity as the conventional art. In addition, no matter how many layers of semiconductor packages 10 are added to the assembly, the spread of the assembly remains the least.

Thus, the compactness with which the semiconductor package 10 can be provided can be dramatically improved. If these semiconductor packages 10 are used in the electronic gadgets, then compact, thin electronic gadgets with high functionality and high efficiency can be obtained.

In the semiconductor module according to the second embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

The semiconductor module of the second embodiment is very easy to maintain as the connector pins 60—sockets 100 mechanism allows easy assembly/disassembly. This will speed up change of component when necessary (e.g. for checking) and enable easy addressing of any problem that may arise.

A third embodiment of this invention will be explained below. In the semiconductor module of the first embodiment, the external connecting leads 50 are provided as the external connecting terminals on the bottommost substrate 20'. However, in this third embodiment, the bottommost substrate is provided with balls (bumps) on one of its surface as external connecting terminals.

Figure 4:
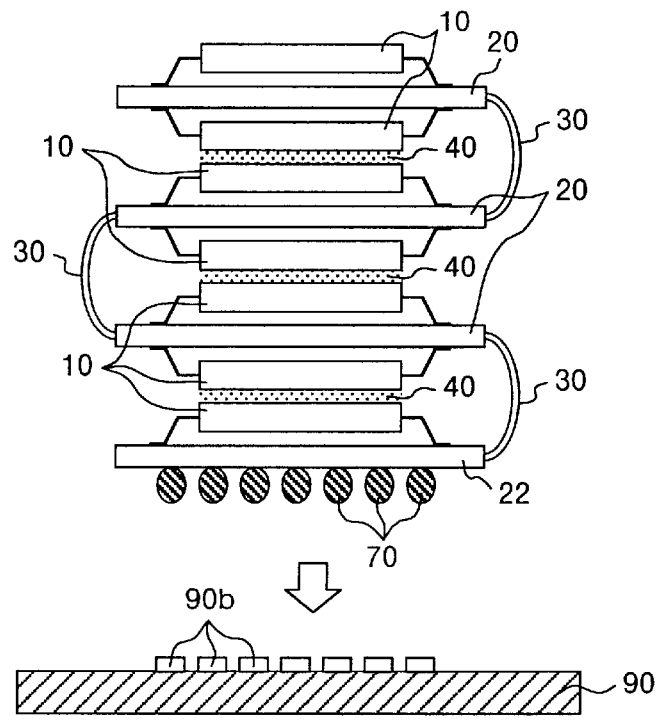
FIG. 4 is a side view of the semiconductor module of the third embodiment of the present invention.

FIG. 4 shows the semiconductor module of the third embodiment. As shown in this figure, balls 70 for soldering are provided on the surface of the bottommost substrate 22. These balls 70 can be soldered to the connecting terminal pads 90b that are provided on the motherboard 90 by heating and pressing.

The other features of the semiconductor module of the third embodiment are similar to those of the semiconductor module of the first embodiment. In other words, the plurality of substrates 20 and the bottommost substrate 22 are serially connected by the flexible cable 30 and are stacked together. The adhesive material 40 holds the adjoining semiconductor packages 10 by bonding.

Since the semiconductor module of the third embodiment is assembled as described above—with semiconductor packages 10 mounted on the two surfaces of the substrates 20 and also on the bottommost substrate 22 and stacked up together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness. Moreover, since the semiconductor module can be mounted on the motherboard 90 by soldering the balls 70 provided on the bottommost substrate 22 to connecting terminal pads 90b on the motherboard 90, it does not matter even if the balls 70 have the same rigidity as the conventional art. In addition, no matter how many layers of semiconductor packages 10 are added to the assembly, the spread of the assembly remains the least.

Thus, the compactness with which the semiconductor package 10 can be provided can be dramatically improved. If these semiconductor packages 10 are used in the electronic gadgets, then compact, thin electronic gadgets with high functionality and high efficiency can be obtained.

In the semiconductor module according to the third embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

In the semiconductor module of the third embodiment, a semiconductor chip is not provided on the bottom surface of the bottommost substrate 22. As a result, in the semiconductor module of the third embodiment, the space between the bottommost substrate 22 and the motherboard 90 on which the semiconductor module is mounted is comparatively less than that in the first and second embodiments. Therefore, the effective height of the overall assembly from the motherboard 90 is considerably reduced, thus achieving further compactness.

A fourth embodiment of this invention will be explained below. In the semiconductor module of the first embodiment, the bottommost substrate 20' is provided with the external connecting leads 50 as external connecting terminals. However, in this fourth embodiment, members for soldering (i.e. bumps) are provided as the external connecting terminals.

Figure 5:
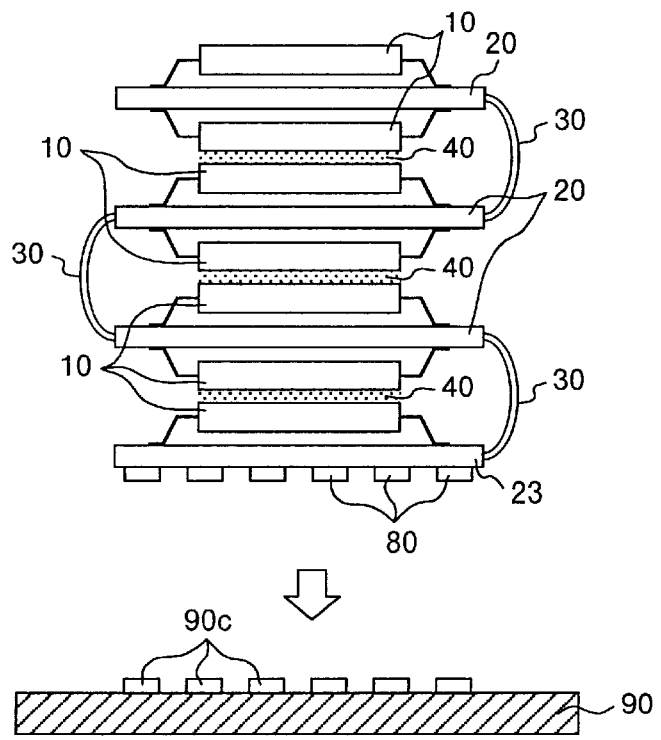
FIG. 5 is a side view of the semiconductor module of the forth embodiment of the present invention.

FIG. 5 shows the semiconductor module of the fourth embodiment. As shown in this figure, members 80 are provided on the outer surface of the bottommost substrate 23. These members 80 can be soldered and pressed on to connecting terminal pads 90c provided on the motherboard 90.

The other features of the semiconductor module of the forth embodiment are similar to those of the semiconductor module of the first embodiment. In other words, the plurality of substrates 20 and the bottommost substrate 23 are serially connected by the flexible cable 30 and are stacked together. The adhesive material 40 holds the adjoining semiconductor packages 10 by bonding.

Since the semiconductor module of the forth embodiment is assembled as described above—with semiconductor packages 10 mounted on the two surfaces of the substrates 20 and also on the bottommost substrate 23 and stacked up together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness. Moreover, as the semiconductor module can be mounted on the motherboard 90 by the components 80 provided to the bottommost substrate 23, it does not matter even if the connector pins 60 have the same rigidity as the conventional art. In addition, no matter how many layers of semiconductor packages 10 are added to the assembly, the spread of the assembly remains the least.

Thus, the compactness with which the semiconductor package 10 can be provided can be dramatically improved. If these semiconductor packages 10 are used in the electronic gadgets, then compact, thin electronic gadgets with high functionality and high efficiency can be obtained.

In the semiconductor module according to the forth embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

In the semiconductor module of the fourth embodiment, a semiconductor chip is not provided on the bottom surface of the bottommost substrate 23. As a result, in the semiconductor module of the forth embodiment, the space between the bottommost substrate 23 and the motherboard 90 on which the semiconductor module is mounted is comparatively less than that in the first and second embodiments. Therefore, the effective height of the overall assembly from the motherboard 90 is considerably reduced, thus achieving further compactness.

A fifth embodiment of this invention will be explained below. In the semiconductor module of the third embodiment, the balls 70 are provided on bottommost substrate 22'. However, in this fifth embodiment, dummy balls 110 (i.e. dummy members) for soldering are further provided on one surface of the bottommost substrate along with the balls 70.

Figure 6A:
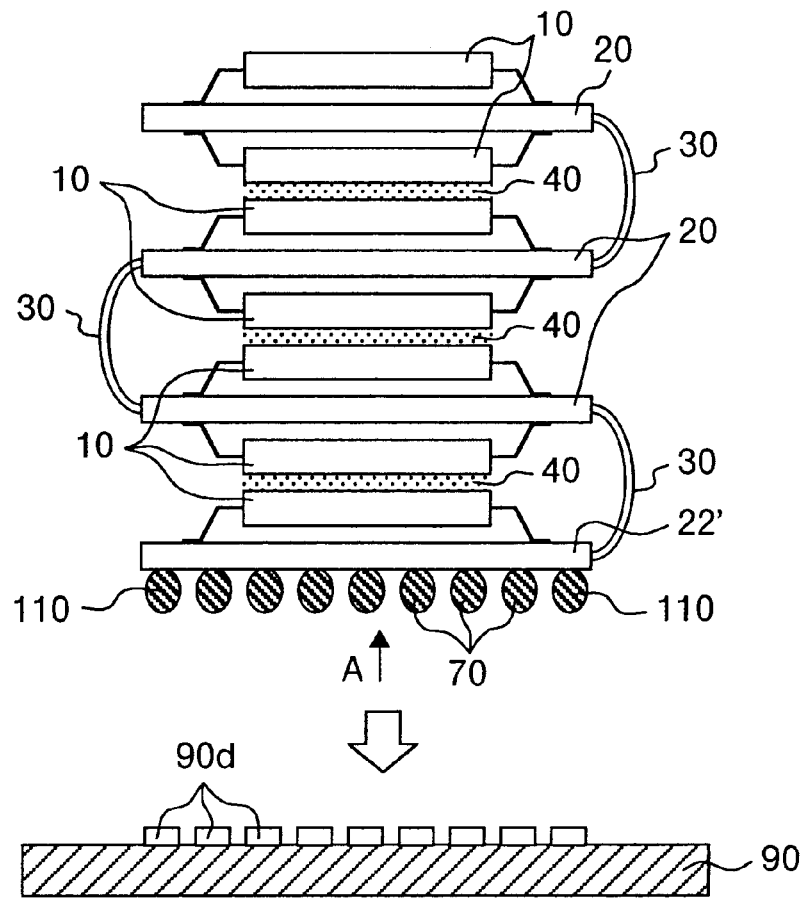
Figure 6B:
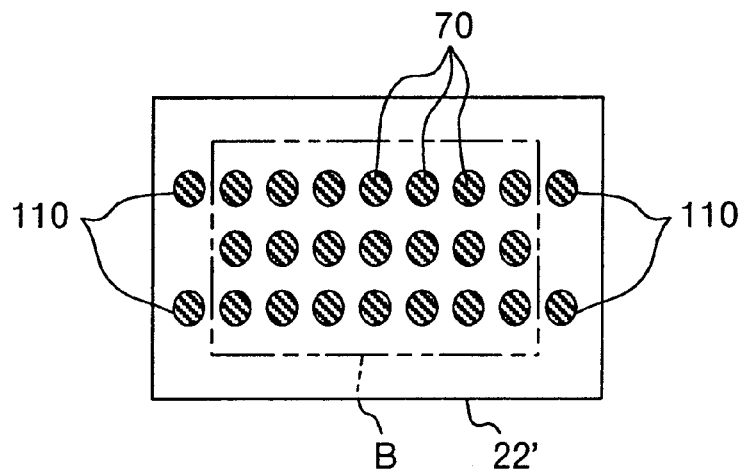

FIG. 6A and FIG. 6B show the semiconductor module of the fifth embodiment. FIG. 6A is a side view of the semiconductor module of the fifth embodiment and FIG. 6B is a view along a direction indicated by an arrow A in FIG. 6A. As shown in FIG. 6A, the bottommost substrate 22' is provided with balls 70 on its one surface. In addition, dummy balls 110 are provided in a space between the edge of the substrate 22' and the last or the first one of the balls 70. As shown in FIG. 6B, the balls 70 are provided on the back surface of the substrate 22' inside the imaginary rectangle shown by a dashed line B. The dummy balls 110 are provided at several positions (4 balls shown in FIG. 6B) between the edge of the substrate 22' and outside the imaginary boundary of the area in which the balls 70 are provided. The balls 70 and the dummy balls 110 are soldered to the connecting terminal pads 90d provided on the motherboard 90 by heating and pressing, in the same manner as in the third embodiment. The dummy balls 110 can be provided at any position, since it is not instrumental in establishing any kind of electrical connection between the semiconductor package 10 and the substrate 22'.

The other features of the semiconductor module of the fifth embodiment are similar to those of the semiconductor module of the first embodiment. In other words, the plurality of substrates 20 and the bottommost substrate 22' are serially connected by the flexible cable 30 and are stacked together. The adhesive material 40 holds the adjoining semiconductor packages 10 by bonding.

Since the semiconductor module of the fifth embodiment is assembled as described above—with semiconductor packages 10 mounted on the two surfaces of the substrates 20 and also on the bottommost substrate 22' and stacked up together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness. Moreover, since the semiconductor module can be mounted on the motherboard 90 by soldering the balls 70 and the dummy balls 110 provided on the bottommost substrate 22' to connecting terminal pads 90d on the motherboard 90, it does not matter even if the balls 70 and the dummy balls 110 have the same rigidity as the conventional art. In addition, no matter how many layers of semiconductor packages 10 are added to the assembly, the spread of the assembly remains the least.

Thus, the compactness with which the semiconductor package 10 can be provided can be dramatically improved. If these semiconductor packages 10 are used in the electronic gadgets, then compact, thin electronic gadgets with high functionality and high efficiency can be obtained.

In the semiconductor module according to the fifth embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

In the semiconductor module of the fifth embodiment, a semiconductor chip is not provided on the bottom surface of the bottommost substrate 22'. As a result, in the semiconductor module of the fifth embodiment, the space between the bottommost substrate 22' and the motherboard 90 on which the semiconductor module is mounted is comparatively less than that in the first and second embodiments. Therefore, the effective height of the overall assembly from the motherboard 90 is considerably reduced, thus achieving further compactness.

Moreover, since the dummy balls 110 are additionally provided between the bottommost substrate 22' and motherboard 90, there is an increase in the number of points of contact between the bottommost substrate 22' and motherboard 90. This increase in the points of contact helps smoothen out the distortions that may occur if the substrate 22' or the motherboard 90 are subjected to any kind of external stress that causes them to bend. In addition, since the dummy balls 110 are positioned outside the imaginary boundary of area in which the balls 70 are provided, the possibility of mounting the semiconductor module on the motherboard 90 in a slating posture can be effectively eliminated.

A sixth embodiment of this invention will be explained below. In this sixth embodiment, dummy members are provided in the same manner as in the semiconductor module of the fifth embodiment. However, the difference is that, the dummy members in the semiconductor module of the sixth embodiment are in the form of dummy leads rather than the dummy balls 110 as in the fifth embodiment.

Figure 7A:
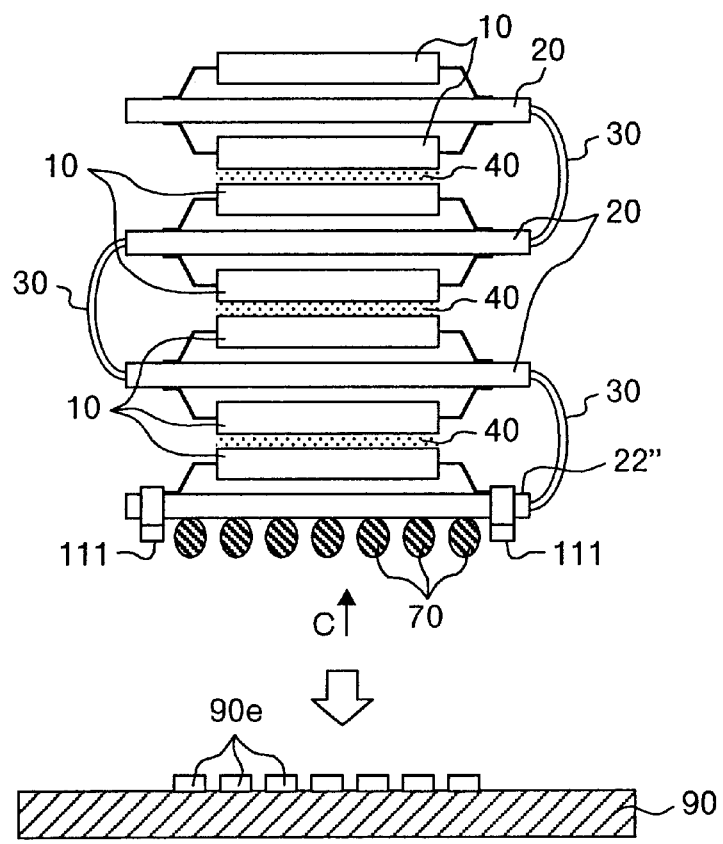
FIG. 7A is a side view and FIG. 7B is a view along a direction indicated by an arrow C in FIG. 7A.
Figure 7B:
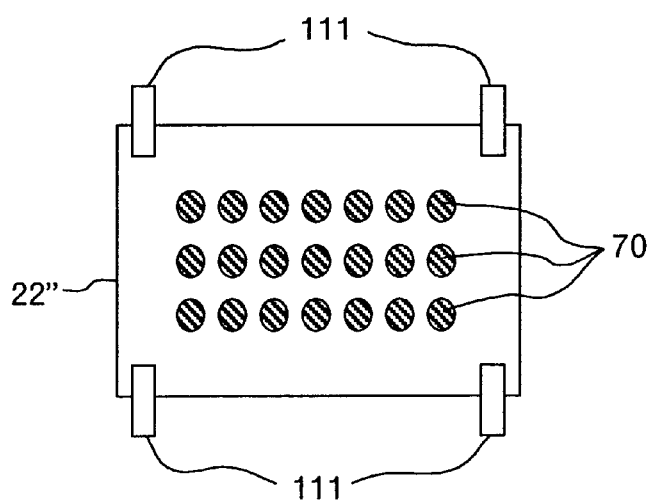

FIG. 7A and FIG. 7B show the semiconductor module of the sixth embodiment. FIG. 7A shows a side view of the semiconductor module of the sixth embodiment and FIG. 7B is a view along a direction indicated by an arrow C in FIG. 7A. The bottommost substrate 22" is provided with the balls 70 on one of its surfaces. In addition, dummy leads 111 are provided in a space of the substrate 22" on which the balls 70 are not provided. In other words, as shown in FIG. 7B, the balls 70 are provided in the central place of the substrate 22" and the dummy leads 111 are provided at several positions (4 places as is shown in FIG. 7B) in places outside the area in which the balls 70 are provided. The balls 70 and the connecting terminal pads 90e in this sixth embodiment are connected in the same way as the balls 70 and the connecting terminal pads 90d in the third embodiment. In other words, the balls 70 are soldered to the connecting terminal pads 90e provided on the motherboard 90 by heating and pressing. The dummy leads 111 are provided on the substrate 22" extending downward and their length is kept slightly shorter than the height of the balls 70 so that when the balls 70 are soldered to the connecting terminal pads 90e, their effective heights may match. The dummy leads 111 can be placed at any position since it is not instrumental in establishing any kind of electric connection between the semiconductor package 10 and the bottommost substrate 22".

The other features of the semiconductor module of the sixth embodiment are similar to those of the semiconductor module of the first embodiment. In other words, the plurality of substrates 20 and the bottommost substrate 22" are serially connected by the flexible cable 30 and are stacked together. The adhesive material 40 holds the adjoining semiconductor packages 10 by bonding.

Since the semiconductor module of the sixth embodiment is assembled as described above—with semiconductor packages 10 mounted on the two surfaces of the substrates 20 and also on the bottommost substrate 22" and stacked up together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness. Moreover, since the semiconductor module can be mounted on the motherboard 90 by soldering the balls 70 provided on the bottommost substrate 22" to connecting terminal pads 90e on the motherboard 90, it does not matter even if the balls 70 have the same rigidity as the conventional art. In addition, no matter how many layers of semiconductor packages 10 are added to the assembly, the spread of the assembly remains the least.

Thus, the compactness with which the semiconductor package 10 can be provided can be dramatically improved. If these semiconductor packages 10 are used in the electronic gadgets, then compact, thin electronic gadgets with high functionality and high efficiency can be obtained.

In the semiconductor module according to the sixth embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

In the semiconductor module of the sixth embodiment, a semiconductor chip is not provided on the bottom surface of the bottommost substrate 22'. As a result, in the semiconductor module of the fifth embodiment, the space between the bottommost substrate 22' and the motherboard 90 on which the semiconductor module is mounted is comparatively less than that in the first and second embodiments. Therefore, the effective height of the overall assembly from the motherboard 90 is considerably reduced, thus achieving further compactness.

Moreover, since the dummy leads 111 are additionally provided between the bottommost substrate 22" and motherboard 90, there is an increase in the number of points of contact between the bottommost substrate 22" and motherboard 90. This increase in the points of contact helps smoothen out the distortions that may occur if the substrate 22" or the motherboard 90 are subjected to any kind of external stress that causes them to bend. In addition, since the dummy leads 111 are positioned outside the area in which the balls 70 are provided, the possibility of mounting the semiconductor module on the motherboard 90 in a slating posture can be effectively eliminated.

A seventh embodiment of this invention will be explained below. In the semiconductor module of the third embodiment described earlier, the semiconductor package 10, as a semiconductor chip, is mounted on the substrate 20 through the external leads 10a. However, in this seventh embodiment the semiconductor packages 10 are surface-mounted on the substrate.

Figure 8:
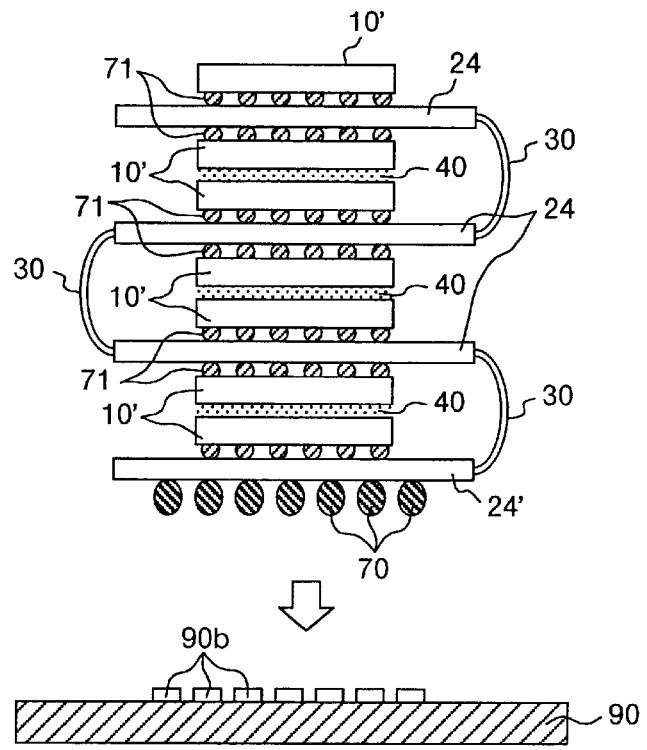
FIG. 8 is a side view of the semiconductor module of the seventh embodiment of the present invention.

FIG. 8 shows the semiconductor module of the seventh embodiment. In this semiconductor module, a semiconductor package 10' is mounted on one surface of the bottommost substrate 24' and on both the surfaces of all the other substrates 24. The semiconductor package 10' is what is known as the BGA (Ball Grid Array) type. A pad 71 is provided on the bottom of the semiconductor package 101 for input/output from the outside. The semiconductor package 10' is surface-mounted on the substrates 24 and the bottommost substrate 24' utilizing the pads 71.

Moreover, balls 70 are provided on one surface of the bottommost substrate 24' in the same manner as in the third embodiment. These balls 70 are soldered to the connecting terminal pads 90b provided on the motherboard 90 by heating and pressing in the same manner as in the third embodiment when mounting the semiconductor module on the motherboard 90 .

The other features of the semiconductor module of the seventh embodiment are similar to those of the semiconductor module of the first embodiment. In other words, the plurality of substrates 24 and the bottommost substrate 24' are serially connected by the flexible cable 30 and are stacked together. The adhesive material 40 holds the adjoining semiconductor packages 10 by bonding.

Since the semiconductor module of the seventh embodiment is assembled as described above—with the semiconductor package 10' mounted on the substrates 24 and the bottommost substrate 24' and stacked up together using the adhesive material 40 between two the adjoining semiconductor packages 10'—the possibility of occurrence of a damage, because of a direct contact between the two adjoining semiconductor packages 10' due to heat generation and vibration, is eliminated without increasing the gap between the packages, i.e. without compromising on the compactness. Moreover, as the semiconductor module can be mounted on the motherboard 90 by soldering the balls 70 provided on the surface of the bottommost substrate 24', it does not matter even if the ball 70 have the same rigidity as the conventional art. In addition, no matter how many layers of semiconductor packages 10' are added to the assembly, the spread of the assembly remains the least.

Thus, the compactness with which the semiconductor package 10' can be provided can be dramatically improved. If these semiconductor packages 10' are used in the electronic gadgets, then compact, thin electronic gadgets with high functionality and high efficiency can be obtained.

In the semiconductor module according to the forth embodiment, not only is the semiconductor package 10' mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

In the semiconductor module of the seventh embodiment, a semiconductor chip is not provided on the bottom surface of the bottommost substrate 24'. As a result, in the semiconductor module of the seventh embodiment, the space between the bottommost substrate 24' and the motherboard 90 on which the semiconductor module is mounted is comparatively less than that in the first and second embodiments. Therefore, the effective height of the overall assembly from the motherboard 90 is considerably reduced, thus achieving further compactness. In addition, since the semiconductor package 10' is surface-mounted, the space between the semiconductor package 10' and the respective substrates 24, and the bottommost substrate 24' can be considerably reduced thereby further reducing the effective assembly height.

An eighth embodiment of this invention will be explained below. In the semiconductor module of the third embodiment described above, the semiconductor package 10, as a semiconductor chip, is mounted on the substrate 20 through the external leads 10a. However, in this eighth embodiment, a semiconductor chip to be bare-chip-mounted on the substrate is adopted.

Figure 9:
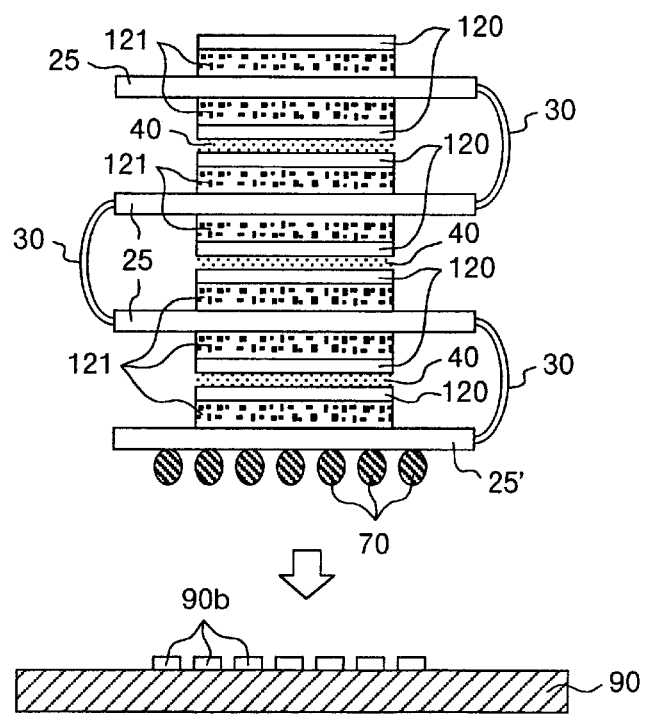
FIG. 9 is a side view of the semiconductor module of the eighth embodiment of the present invention.

FIG. 9 shows the semiconductor module of the eighth embodiment. In this semiconductor module, a semiconductor chip 120 is mounted on one of the surfaces of the bottommost substrate 25', and semiconductor chips 120 are mounted on both the surfaces of the other substrates 25. This semiconductor chip 120 is a bare chip and is mounted on the substrates 25 and, the bottommost substrate 25' through an anisotropic conducting film 121. The anisotropic conducting film 121 cuts an electrical conductivity between the semiconductor chip and the substrate at certain portion and allows an electrical conductivity between the semiconductor chip and the substrate in other portions.

Moreover, balls 70 are provided on one surface of the bottommost substrate 25' in the same manner as in the third embodiment. These balls 70 are soldered to the connecting terminal pads 90b provided on the motherboard 90 by heating and pressing in the same manner as in the third embodiment when mounting the semiconductor module on the motherboard 90.

The other features of the semiconductor module of the eighth embodiment are similar to those of the semiconductor module of the first embodiment. In other words, the plurality of substrates 25 and the bottommost substrate 25' are serially connected by the flexible cable 30 and are stacked together. The adhesive material 40 holds the adjoining semiconductor chips 120 by bonding.

Since the semiconductor module of the eighth embodiment is assembled as described above—with the semiconductor chip 120 mounted on the substrate 25 and the bottommost substrate 25' and stacked up together using the adhesive material 40 between two the adjoining semiconductor chips 120—the possibility of occurrence of a damage, because of a direct contact between the two adjoining semiconductor chips 120 due to heat generation and vibration, is eliminated without increasing the gap between the semiconductor chips, i.e. without compromising on the compactness. Moreover, as the semiconductor module can be mounted on the motherboard 90 by soldering the balls 70 provided on the surface of the bottommost substrate 25', it does not matter even if the ball 70 have the same rigidity as the conventional art. In addition, no matter how many layers of semiconductor chips 120 are added to the assembly, the spread of the assembly remains the least.

Thus, the compactness with which the semiconductor chips 120 can be provided can be dramatically improved. If these semiconductor chips 120 are used in the electronic gadgets, then compact, thin electronic gadgets with high functionality and high efficiency can be obtained.

In this semiconductor module according to the eighth embodiment, not only are the semiconductor chips 120 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated.

In the semiconductor module of the eighth embodiment, a semiconductor chip is not provided on the bottom surface of the bottommost substrate 25'. As a result, in the semiconductor module of the eighth embodiment, the space between the bottommost substrate 25' and the motherboard 90 on which the semiconductor module is mounted is comparatively less than that in the first and second embodiments. Therefore, the effective height of the overall assembly from the motherboard 90 is considerably reduced, thus achieving further compactness. In addition, since the semiconductor chip 120 is surface-mounted, the space between the semiconductor chip and the respective substrates 25, and the bottommost substrate 25' can be considerably reduced thereby further reducing the effective assembly height.

A ninth embodiment of this invention will be explained below. In the semiconductor module of the first embodiment, the substrates 20 and the bottommost substrate 20' are mounted in such a manner they are substantially parallel to the motherboard 90. However, in the semiconductor module of the ninth embodiment, the substrates are mounted in such a manner they are substantially perpendicular to the motherboard 90.

Figure 10:
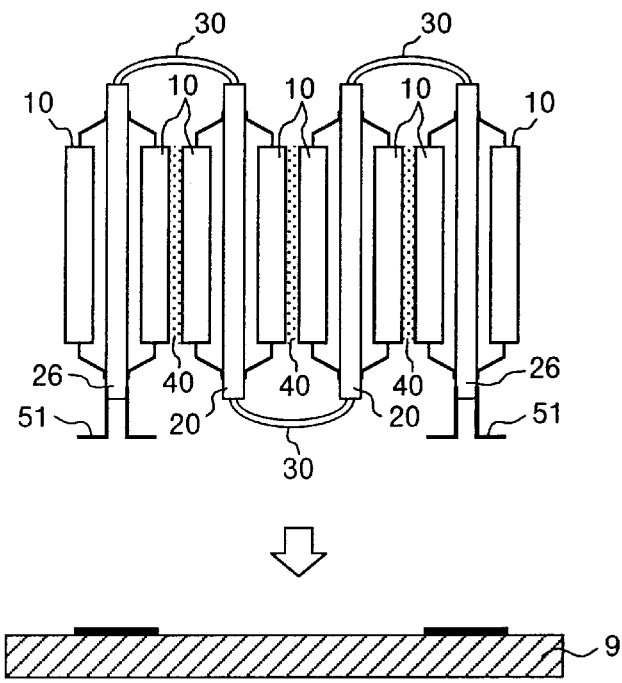
FIG. 10 is a side view of the semiconductor module of the ninth embodiment of the present invention.

FIG. 10 shows the semiconductor module of the ninth embodiment. In this semiconductor module, external connecting leads 51 are provided on the end of each of the substrates 26 on the sides of the assembly ("side substrates"). These external connecting leads 51 extend beyond the ends of the remaining substrates 20 positioned in between the side substrates 26 well as the curve of the flexible cable 30 that connects the substrates.

The other features of the semiconductor module of the ninth embodiment are similar to those of the semiconductor module of the first embodiment. In other words, the plurality of substrates 20 and the side substrates 26 are serially connected by the flexible cable 30 and are stacked together. The adhesive material 40 holds the adjoining semiconductor packages 10 by bonding.

Although not shown in the figure, the external connecting leads 51 mounted on the side substrate 26 are connected to the wiring pattern of the side substrate 26. The semiconductor package (i.e. the semiconductor chips) 10 mounted on the substrates 20 and the side substrates 26 performs the desired function when the semiconductor module is mounted on the motherboard 90 through the external connecting leads 51.

Since the semiconductor module of the ninth embodiment is assembled as described above—with the semiconductor package 10 mounted on two surfaces of the substrates 20 and on one surface of the side substrates 26 and stacked together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness.

When the side substrates 26 are connected to the motherboard 90 utilizing the external connecting leads 51, the substrates 26 are positioned upright with respect to the motherboard 90, and it does not matter even if the external connecting leads 51 have the same rigidity as the conventional art. In addition, the height of the assembly remains constant, irrespective of how many semiconductor packages 10 are stacked together.

Thus, the compactness with which the semiconductor package 10 can be provided can be dramatically improved. If these semiconductor packages 10 are used in the electronic gadgets, then compact, thin electronic gadgets with high functionality and high efficiency can be obtained. Moreover, the functionality can be further enhanced the number of semiconductor packages being stacked will not have any bearing on the height of the assembly.

In the semiconductor module according to the ninth embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

The semiconductor module is firmly mounted on the motherboard 90 and it is ensured and held in place with respect to each other on the motherboard 90 because of the side substrates 26.

The semiconductor module of the ninth embodiment may also have, like the semiconductor modules of the seventh and eighth embodiments, surface-mounted BGA type semiconductor chips or bare chips.

A tenth embodiment of this invention will be explained below. The semiconductor module of the ninth embodiment uses the external connecting leads 51 as external connecting terminals provided at the ends of the side substrates. In the tenth embodiment, connector terminals as external connecting terminals are provided on the side substrates.

Figure 11:
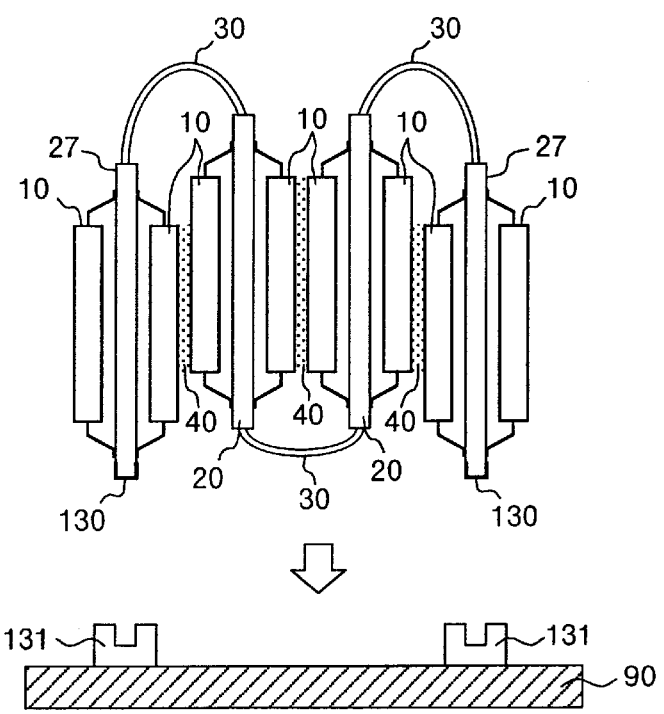
FIG. 11 is a side view of the semiconductor module of the tenth embodiment of the present invention.
Figure 12A:
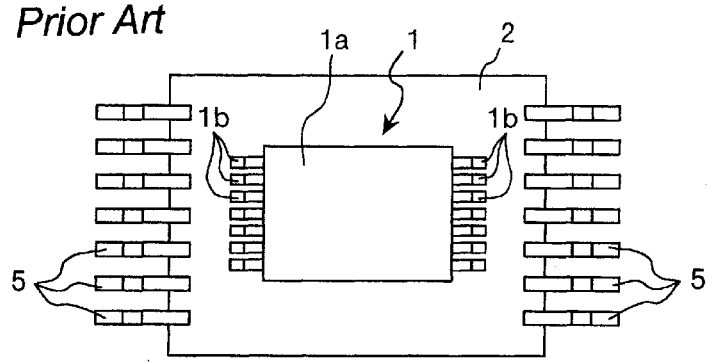
Figure 12B:
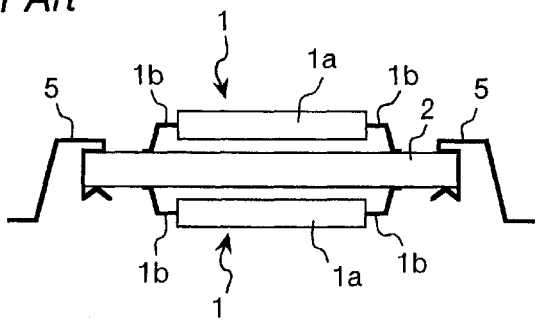
Figure 13A:
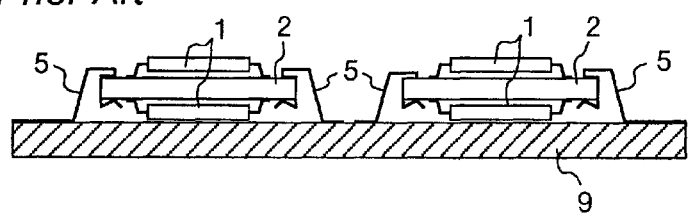
Figure 13B:
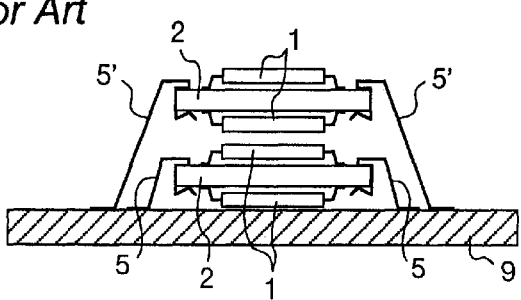

FIG. 11 shows the semiconductor module of the tenth embodiment. The side substrates 27 are offset with respect to the other substrates 20. Moreover, connector terminals 130 are provided at the protruding ends of the side substrates 27. Connectors 131 are provided at the corresponding positions on the motherboard 90 for receiving the connector terminals 130 of the side substrates 27.

The other features of the semiconductor module of the tenth embodiment are similar to those of the semiconductor module of the first embodiment. In other words, the plurality of substrates 20 and the side substrates 27 are serially connected by the flexible cable 30 and are stacked together. The adhesive material 40 holds the adjoining semiconductor packages 10 by bonding.

Although not shown in the figure, the connector terminals 130 provided on the side substrate 27 are connected to the wiring pattern of the side substrate 27. The semiconductor package (i.e. the semiconductor chips) 10 mounted on the substrates 20 and the side substrates 27 performs the desired function when the semiconductor module is mounted on the motherboard 90 through the connector terminals 130.

Since the semiconductor module of the tenth embodiment is assembled as described above—with the semiconductor package 10 mounted on two surfaces of the substrates 20 and on one surface of the side substrates 27 and stacked together using the adhesive material 40 between two the adjoining semiconductor packages 10—the possibility of occurrence of a damage, because of a direct contact between the two adjoining semiconductor packages 10 due to heat generation and vibration, is eliminated without increasing the gap between the packages, i.e. without compromising on the compactness.

When the side substrates 27 are connected to the motherboard 90 through the connector terminals 130, the substrates 27 are positioned upright with respect to the motherboard 90, and it does not matter even if the connector terminals 130 have the same rigidity as the conventional art. In addition, the height of the assembly remains constant, irrespective of how many semiconductor packages 10 are stacked together.

Thus, the compactness with which the semiconductor package 10 can be provided can be dramatically improved. If these semiconductor packages 10 are used in the electronic gadgets, then compact, thin electronic gadgets with high functionality and high efficiency can be obtained. Moreover, the functionality can be further enhanced the number of semiconductor packages being stacked will not have any bearing on the height of the assembly.

In the semiconductor module according to the tenth embodiment, not only is the semiconductor package 10 mounted on the relatively rigid substrate, but also the flexible cable 30 connects two adjoining substrates. As a result, even if the gap between two substrates is narrow, any danger of providing a stress to the substrates and the semiconductor packages due to deformation of the flexible cable 30 is eliminated, thereby making the semiconductor module more reliable.

The semiconductor module is firmly mounted on the motherboard 90 and it is ensured and held in place with respect to each other on the motherboard 90 because of the side substrates 27.

The semiconductor module of the tenth embodiment is very easy to maintain as the connector terminal 130—connector 131 mechanism allows easy assembly/disassembly. This will speed up change of component when necessary (e.g. for checking) and enable easy addressing of any problem that may arise.

The semiconductor module of the tenth embodiment may also have, like the semiconductor modules of the seventh and eighth embodiments, surface-mounted BGA type semiconductor chips or bare chips.

In the semiconductor module of the tenth embodiment, it has been shown that the side substrates 27 provided with the connector terminal 130 protrude as compared to the other substrates 20. However, the structure is not limited to this case. It is only desirable that the ends of the substrates 20 other than that the side substrates do not touch the motherboard 90. This may be achieved by even increasing the height of the connectors 131 rather than making the side substrates 27 protrude.

All the figures in the first to tenth embodiments show four substrates being stacked together. However, this is only an example. It is enough that the number of substrates being stacked together is two or more.

According to this invention, the plurality of substrates, with semiconductor chips mounted on them, are assembled together, with an adhesive material between chips facing each other. As a result, it is possible to prevent direct contact of the semiconductor chips with minimal space between them. This improves the compactness of the semiconductor module by minimizing the outer dimensions in the direction in which the semiconductor chips are stacked.

Moreover, the space required on the motherboard to mount the semiconductor module is also minimized if the module is mounted with the help of the external connecting terminal provided on the outermost substrates.

Furthermore, it is possible to mount semiconductor chips on the back side of the outermost substrates since the semiconductor module is mounted on the motherboard with the help of leads.

Moreover, the maintenance of this semiconductor module is rendered easy by provision of connector pin-socket arrangement which facilitates easy assembling and dismantling of the semiconductor module on the motherboard.

Furthermore, the height of the assembly from the motherboard is reduced considerably as the semiconductor module is mounted on the motherboard by using the bumps as compared to mounting using leads.

Moreover, highly reliable surface-mounting can be achieved because of straightening out of bump distortions by dummy components and prevention of the imperfect mounting due to the bump distortions.

Furthermore, the plurality of substrates are positioned upright when the semiconductor module is mounted on the motherboard with the help of the external connecting terminals. Since the height of the assembly is not affected by adding semiconductor chips, any number of them may be added to enhance the function of the semiconductor module.

Moreover, the substrates are held securely in place with respect to each other on the motherboard due to which the entire semiconductor module sits firmly on the motherboard.

Furthermore, direct contact between the semiconductor module and the motherboard on which it is mounted is avoided because semiconductor module is mounted on the motherboard through the leads.

Moreover, maintenance of the semiconductor module is rendered easy due to provision of connector terminal-connector arrangement to enable easy assembling and dismantling of the semiconductor module on the motherboard.

Furthermore, any additional substrate is positioned above the substrates with connector terminals which are mounted on the motherboard thereby avoiding contact between the ends of the additional substrates and the motherboard.

Moreover, the semiconductor module can be built by assembling the semiconductor chips with the external leads.

Furthermore, the semiconductor chip is surface-mounted on the substrate, thereby reducing the effective height of the semiconductor chip with respect to the substrate and achieving compactness.

Moreover, the semiconductor chips are bare-chip-mounted on the substrate, thereby reducing the effective height of the semiconductor chip with respect to the substrate and achieving compactness.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor module comprising a plurality of substrates connected serially through a common flexible cable and stacked together, wherein semiconductor chips are mounted on at least mutually facing surfaces of said substrates, and said semiconductor chips of adjoining ones of said substrates being bonded to each other.

2. The semiconductor module according to claim 1, further comprising a motherboard, wherein at least one of an outermost substrate in said stacked substrates is provided with external connecting terminals by which said outermost substrate can be mounted on said motherboard.

3. The semiconductor module according to claim 1, wherein said flexible cable penetrates each of the substrates, and said semiconductor chips are each connected to the flexible cable within the corresponding substrates.

4. The semiconductor module according to claim 2, wherein said external connecting terminals are leads extending outward from said outermost substrate.

5. The semiconductor module according to claim 2, wherein a plurality of sockets corresponding to said external connecting terminals of said substrates are provided on said motherboard, and said external connecting terminals are connector pins that can be inserted into or removed from said sockets provided on said motherboard.

* * * * *